United States Patent
Guha et al.

(10) Patent No.: US 6,274,461 B1
(45) Date of Patent: Aug. 14, 2001

(54) METHOD FOR DEPOSITING LAYERS OF HIGH QUALITY SEMICONDUCTOR MATERIAL

(75) Inventors: Subhendu Guha; Chi C. Yang, both of Troy, MI (US)

(73) Assignee: United Solar Systems Corporation, Troy, MI (US)

( * ) Notice: Subject to any disclaimer, the term of this patent is extended or adjusted under 35 U.S.C. 154(b) by 0 days.

(21) Appl. No.: 09/377,652

(22) Filed: Aug. 19, 1999

Related U.S. Application Data
(60) Provisional application No. 60/097,208, filed on Aug. 20, 1998.

(51) Int. Cl.$^7$ .................................................. H01L 21/20
(52) U.S. Cl. ............................ 438/478; 438/485; 438/96
(58) Field of Search ................................ 438/48, 96, 97, 438/93, 478, 479, 482, 485, 488, 487; 427/575

(56) References Cited

U.S. PATENT DOCUMENTS

| | | | |
|---|---|---|---|
| 5,334,423 | * 8/1994 | Guha et al. | 427/575 |
| 5,637,537 | * 6/1997 | Nath et al. | 438/460 |
| 5,646,050 | * 7/1997 | Li et al. | 438/485 |
| 5,730,808 | * 3/1998 | Yang et al. | 438/485 |

OTHER PUBLICATIONS

D.V. Tsu et al., "Effect of hydrogen dilution on the structure of amorphous silicon alloys", Applied Physics Letters, vol. 71, No. 10 (Sep. 8, 1997), pp. 1317–1319.

Joohyun Koh, et al., "Optimization of hydrogenated amorphous silicon p–i–n solar cells with two–step i layers guided by real–time spectroscopic ellipsometry", Applied Physics Letters, vol. 73, No. 11 (Sep. 14, 1998), pp. 1526–1528.

U. Kroll et al., "From amorphous to microcrystalline silicon films prepared by hydrogen dilution using the VHF (70 MHz) GD technique," Journal of Non–Crystalline Solids 227–230 (1998), pp. 69–72.

* cited by examiner

Primary Examiner—Savitri Mulpuri
(74) Attorney, Agent, or Firm—Gifford, Krass, Groh, Sprinkle, Anderson & Citkowski, P.C.

(57) ABSTRACT

Plasma deposition of substantially amorphous semiconductor materials is carried out under a set of deposition parameters which are selected so that the process operates near the amorphous/microcrystalline threshold. This threshold varies as a function of the thickness of the depositing semiconductor layer; and, deposition parameters, such as diluent gas concentrations, must be adjusted as a function of layer thickness. Also, this threshold varies as a function of the composition of the depositing layer, and in those instances where the layer composition is profiled throughout its thickness, deposition parameters must be adjusted accordingly so as to maintain the amorphous/microcrystalline threshold.

8 Claims, 2 Drawing Sheets

METHOD FOR DEPOSITING LAYERS OF HIGH QUALITY SEMICONDUCTOR MATERIAL

RELATED APPLICATION

This patent application claims priority of provisional application Ser. No. 60/097,208 filed Aug. 20, 1998 and entitled "Method for Depositing Layers of High Quality Semiconductor Material."

This work was supported by National Renewable Energy Laboratory under Contract No. ZAK-8-17619-09.

FIELD OF THE INVENTION

This invention relates generally to semiconductor materials. More specifically, the invention relates to thin film semiconductor materials. Most specifically, the invention relates to high quality thin film semiconductor materials and methods for their manufacture.

BACKGROUND OF THE INVENTION

This invention relates generally to thin film semiconductor materials. Within the context of this disclosure, thin film semiconductor materials comprise materials which are deposited by building up thin layers on a substrate, typically through a vapor deposition process. Such processes include plasma deposition processes (also referred to as plasma chemical vapor deposition processes), wherein a process gas, typically comprised of a semiconductor precursor and generally a diluent gas, is subjected to an electrical field which ionizes the gas so as to create a reactive plasma. The plasma decomposes at least some components of the process gas and deposits a layer of semiconductor material onto a substrate maintained in, or in close proximity to, the plasma. Nonplasma vapor deposition processes such as nonplasma chemical vapor deposition and evaporation processes may be similarly employed for the preparation of thin film semiconductor materials.

Thin film semiconductor materials are generally considered to be disordered semiconductor materials insofar as they are not single crystalline materials. Within the context of this disclosure, the terms "thin film semiconductor materials" and "disordered semiconductor materials" shall be used interchangeably to refer to those semiconductor materials which are lacking in long range order (i.e. are not in a single crystalline state). Thin film semiconductor materials can have short range order or intermediate range order, and may comprise amorphous semiconductor materials as well as nanocrystalline and microcrystalline semiconductor materials.

The degree of ordering has been found to be an important characteristic of thin film semiconductor materials. For example, in the field of photovoltaic devices, it has been found that the best devices are manufactured when photogenerative material (for example the intrinsic layer in a P-I-N device) is amorphous, but is prepared from material obtained under deposition conditions just below the threshold of microcrystalline growth. See, for example, Tsu et al., *Applied Physics Letters* Vol. 71, No. 10, 1317–1319 (Sep. 8, 1997). Deposition at such conditions near amorphous microcrystalline threshold is generally desirable. Within the context of this disclosure, operation near the amorphous/crystalline threshold means that deposition parameters including process gas composition, process gas pressure, power density, substrate temperature and the like are selected so as to have values which approach those which produce microcrystalline material, but are such that the material is not microcrystalline.

Amorphous material produced under these conditions has good medium range order, and photovoltaic devices produced therefrom have good operational characteristics such as open circuit voltage, fill factor and the like. In addition, these materials have good stability, and are resistant to the formation of light induced defects. As the material becomes microcrystalline, open circuit voltage of the photovoltaic devices decreases. In addition, the presence of grain boundaries in microcrystalline material can adversely affect the performance of the photovoltaic devices. Likewise, if the semiconductor material is deposited so as to be more disordered, problems of device efficiency and stability also arise. Therefore, the photogenerative layers of thin film photovoltaic devices are most preferably fabricated under deposition conditions which are near the amorphous microcrystalline threshold.

The art has not heretofore recognized that this amorphous microcrystalline threshold will vary as the semiconductor layer is being deposited even if all deposition parameters are maintained constant. Therefore, materials prepared according to prior art processes have been less than optimum because of this shift in the amorphous/microcrystalline threshold. Furthermore, photogenerative materials are often fabricated with a graded composition, for example to give profiled band gap, and it has also been found that such compositional gradation can also affect the amorphous microcrystalline threshold. Therefore, the present invention recognizes the fact that the amorphous/microcrystalline threshold for a particular deposition process will shift as a result of semiconductor layer thickness as well as composition variations; and accordingly, the present invention adjusts deposition parameters so as to maintain deposition conditions at the ideal near-threshold level for the entirety of the deposition process. As will be demonstrated hereinbelow, material produced by the present invention is optimized, as is demonstrated by the operational parameters of photovoltaic devices produced therefrom.

BRIEF DESCRIPTION OF THE INVENTION

The present invention is directed to a process for the plasma deposition of a layer of semiconductor material. In general, such process energizes a process gas, which includes a precursor of the semiconductor material, with electromagnetic energy so as to create a plasma therefrom. The plasma deposits a layer of semiconductor material onto a substrate maintained in proximity thereto. The deposition parameters of the process, which include process gas composition, process gas pressure, power density of the electromagnetic energy and substrate temperature, will determine whether the deposited semiconductor material is amorphous or microcrystalline; and most preferably, deposition is carried out under conditions just below the amorphous/microcrystalline threshold so as to produce a relatively ordered amorphous material. In accord with the present invention, deposition parameters are controlled so as to maintain the deposition process at amorphous microcrystalline threshold throughout the entire deposition of the layer.

The amorphous/microcrystalline threshold will vary as the thickness of a semiconductor layer builds, possibly through a templating effect; therefore, various of the process parameters such as gas composition, power density and the like are varied so as to maintain deposition at the threshold. In some instances, composition of the semiconductor material is varied as the layer is being deposited. For example, the semiconductor material may comprise an alloy including silicon and germanium, and the silicon-germanium ratio may be varied so as to produce a profiled band gap structure in the semiconductor material. In such instances, the amorphous microcrystalline threshold will also vary as a function of the ratio of silicon to germanium in the process gas. In accord with the present invention, it has further been found that as the amount of germanium in the process gas increases, the process gas must be diluted with increasing amounts of hydrogen or deuterium so as to maintain conditions at a point near the threshold.

DETAILED DESCRIPTION OF THE INVENTION

Figure 1:
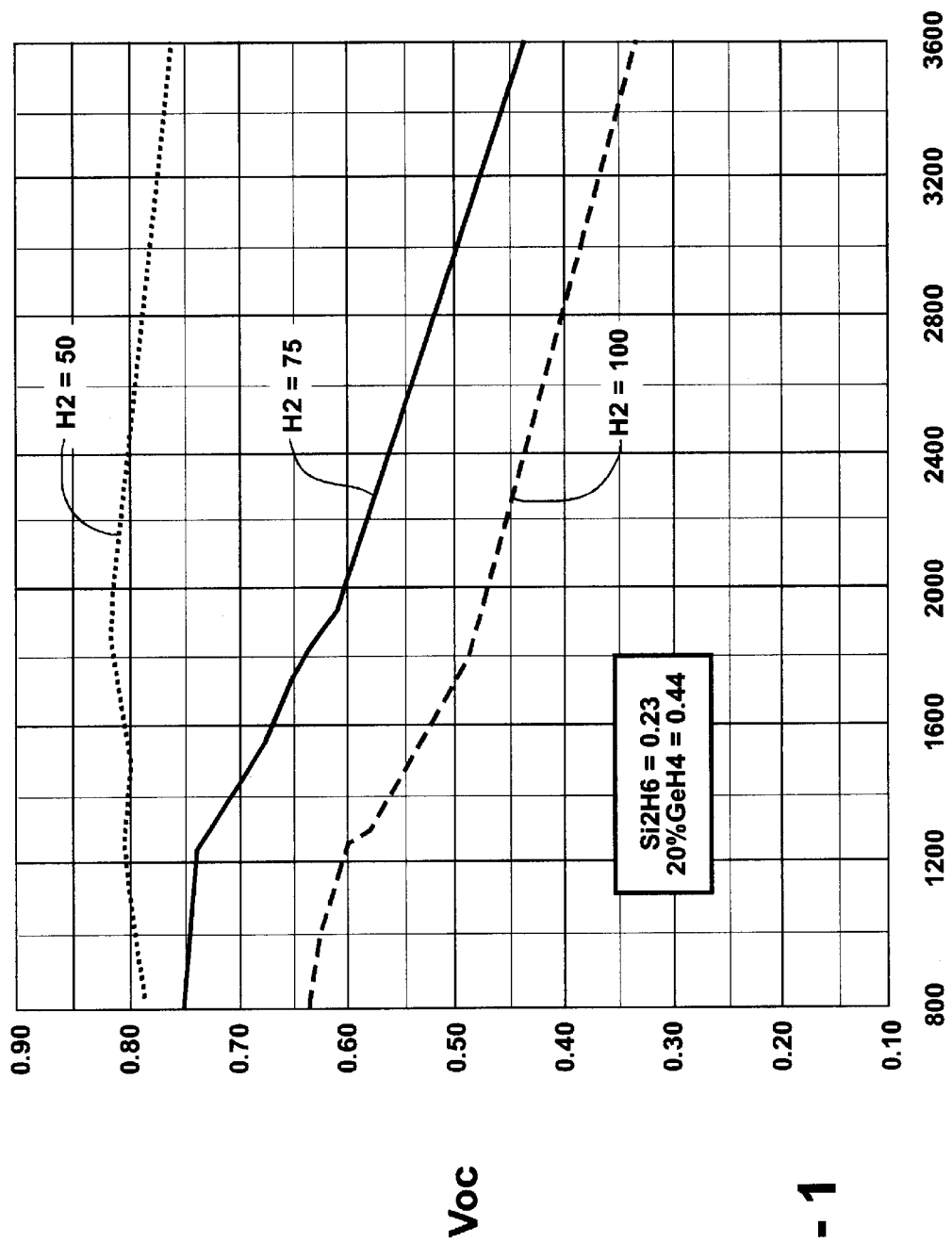
FIG. 1 is a graph showing the open circuit voltage of a first series of photovoltaic devices as a function of the intrinsic layer of each device.

In accord with the present invention, it has been found that under certain deposition conditions the degree of order in thin film semiconductor materials improves as a function of the thickness of the layer of thin film semiconductor material. That is to say, the earlier deposited, bottomward portions of a layer of semiconductor material have a lower degree of ordering than do upper, later deposited, portions of the layer. Within the context of this disclosure "ordering" or "degree of ordering" of a layer refers to the extent of the short range and intermediate order of the constituents of that layer. In a more ordered material, a greater number of constituent atoms will manifest proper valencies and will have bond angles approaching theoretical. In contrast, a more poorly ordered material will have a large number of strained, bent, broken, or unsatisfied bonds. In general, a more ordered material has superior electrical and optical properties as compared to a less ordered material. The degree of order has also been found to be governed by the order of the underlying material. For example, films grown on ordered material tend to have better order than films grown on disordered material.

While Applicants do not wish to be bound by speculation, it is theorized that the ordering in the body of thin film semiconductor material improves as the layer is deposited, as a result of a templating effect. In a templating effect, a freshly deposited surface of semiconductor material provides a template which supports and fosters growth of subsequent layers of semiconductor material thereupon. The ordering of the subsequently deposited layers is generally better than that of the surface which forms the template, since subsequently depositing layers will preferentially align with, and be guided into conformation by, those portions of the templating layer manifesting good order. Consequently, Applicants theorize that the ordering of the depositing body of thin film semiconductor material improves as a function of layer thickness. Verification of this phenomenon has been established by x-ray analysis and capacitive probe analysis of portions of the thickness of various semiconductor bodies.

Furthermore, it has been experimentally observed that when plasma deposition conditions such as process gas pressure, dilution of the gas mixture, substrate temperature, and electromagnetic power density are for the deposition of thin film silicon-hydrogen alloy semiconductors, are selected such that they are below the threshold for the formation of microcrystalline material, and maintained at a constant level, the depositing layer will become microcrystalline as layer thickness increases. The thickness at which the layer will become microcrystalline will depend upon how near the microcrystalline threshold initial deposition conditions are maintained.

The findings which are the basis of this invention have several implications and applications in connection with the fabrication of semiconductor devices. For example, in the manufacture of thin film transistors and other such semiconductor switching devices, deposition of a layer of semiconductor material can be initiated under deposition conditions which are below the threshold for the fabrication of microcrystalline semiconductor material, and deposition can then be carried out until such time as the depositing layer becomes microcrystalline. This will allow for the manufacture of a semiconductor body having separate amorphous and microcrystalline regions in a superposed relationship throughout its thickness, under deposition conditions which are constant. The amorphous and microcrystalline regions of the semiconductor body have significantly different electrical conductivities, as well as different optical properties. Therefore, structures of this type can be employed to define electrodes, gates and other features of transistors and the like.

The present invention may also be employed in the fabrication of photovoltaic devices so as to enable deposition conditions for the various layers of the devices to be optimized in accord with the thicknesses of those layers. For example, in tandem P-I-N type photovoltaic devices, a series of triads of P-I-N configuration are stacked in an optical and electrical series relationship. In order to balance the photo currents produced by the stacked cells, the thicknesses of the I layers of the stacked cells generally increase from the top to the bottom of the device to compensate for different intensities, and possibly wavelengths, of illumination striking those layers. In accord with the present invention, deposition conditions for each of the intrinsic layers may be individually optimized, on the basis of the thicknesses of those layers, so as to optimize the material quality thereof. Also, in some instances, the P and/or N layers of P-I-N type devices are fabricated from thin film semiconductor materials which are entirely, or partially, microcrystalline. Through the use of the present invention, morphology of these layers can be controlled, as a function of their thickness, so as to accurately produce layers which have a desired microcrystalline and/or amorphous morphology throughout their thickness. Also, the template effect can be introduced even at a lower thickness by using doped layers of the desired order to initiate better ordering of the undoped layers deposited on top.

Also, in accord with the present invention, deposition conditions, including one or more of process gas dilution, pressure, power density or substrate temperature, can be varied during the deposition of a single layer of material so as to control the morphology of that layer as desired. For example, deposition conditions may be initially set to a point below the threshold for the deposition of microcrystalline semiconductor material; and as subsequent portions of a layer build up, these deposition conditions can be further varied to a point below the initial threshold setting so that the degree of order of the depositing layer remains essentially constant throughout its thickness. In other instances, deposition conditions can be varied so as to provide a profiled change in the degree of ordering of the material throughout its thickness. Such changes in ordering may be advantageously employed to control the electrical characteristics of interfaces between superposed layers of a semiconductor device.

In another aspect of the present invention, the theorized templating action of a layer may be employed to fabricate a highly ordered layer of thin film semiconductor material, such as a highly microcrystalline layer, under conditions which might otherwise not permit the deposition of a layer having that degree of order. This ability can be useful in the circumstances wherein other portions of a device structure would be harmed by deposition conditions employed to manufacture a highly ordered layer ab initio. In some instances, the semiconductor body may be used in the as-deposited form, while in other instances, the initially deposited, less ordered portion may be removed from the remaining, more ordered portion by techniques such as ion milling, plasma etching, wet chemical etching or the like.

It will thus be seen that the present invention is based upon the finding that in a depositing body of thin film semiconductor material grown under certain deposition conditions, the ordering of the material improves as the layer grows in thickness. It is speculated that this improvement is a result of a templating process wherein an initially deposited layer of first degree of order favors a deposition thereunto of material having a greater degree of order. This finding enables the fabrication of layers of thin film semiconductor material having a highly controlled degree of order through their thickness. This degree of order may be controlled so as to be uniform, or so as to vary. The invention enables the fabrication of controlled layers of microcrystalline and/or nanocrystalline and/or amorphous configuration, and finds utility in the manufacture of a variety of semiconductor devices including photovoltaic devices, thin film transistors, electrophotographic receptors, diodes and the like. The invention is applicable to all thin film semiconductor materials, and has been found to have particular utility in connection with group IV semiconductor alloys such as alloys of silicon and/or germanium with hydrogen and/or halogens.

The present invention will be further illustrated by specific examples comprising P-I-N type photovoltaic devices; although, it is to be understood that the principles of the present invention may be employed, with advantage, in the fabrication of a variety of semiconductor devices. As is known in the art, P-I-N type photovoltaic devices comprise a body of substantially intrinsic semiconductor material interposed between P doped and N doped semiconductor material.

It is known that the best semiconductor material for the intrinsic layer of P-I-N type photovoltaic devices is fabricated under plasma deposition conditions which produce substantially amorphous material, but which are near to the amorphous microcrystalline threshold. When the deposition is carried out under these conditions, the substantially amorphous material has very good short and intermediate range order, which is reflected in the operational parameters of the photovoltaic device, such as open circuit voltage, fill factor and the like. The amorphous/microcrystalline threshold is governed by deposition conditions which include substrate temperature, process gas pressure, power level and gas composition. It has further been found in accord with the present invention that thickness of the depositing layer also influences the amorphous/microcrystalline threshold, as discussed above.

In accord with the present invention, a number of P-I-N type photovoltaic devices were prepared by a plasma activated chemical vapor deposition process of the type generally described by Yang et al. in *Applied Physics Letters,* 70, 2975 (1997). The devices were prepared on stainless steel substrate and include substantially amorphous intrinsic layers comprised of silicon alloys or silicon-germanium alloys. These cells are representative of photovoltaic cells of the type which are typically incorporated into multi-gap tandem photovoltaic devices as is known in the art. In each instance, the cell included an amorphous, phosphorus doped layer of silicon-hydrogen alloy material of approximately 200–500 angstroms thickness, with a layer of substantially amorphous silicon or silicon-germanium alloy material thereatop. The cell was completed by a top layer of microcrystalline boron doped silicon-hydrogen alloy material of approximately 200–500 angstroms thickness. All deposition conditions for the phosphorus doped and boron doped layer were maintained constant throughout the entire experimental series, with the only variations being made during the deposition of the intrinsic layers. Following completion of the cells, operational parameters such as fill factor and open circuit voltage were measured.

In the first experimental series, a number of photovoltaic devices were manufactured utilizing a process gas flow through the deposition chamber of 0.23 SCCM of $Si_2H_6$, and 0.44 SCCM of a 20% mixture of $GeH_4$ in $H_2$, together with either 50, 75 or 100 SCCM of a $H_2$ diluent gas. Cells of this type are generally used as the midgap cells of triple junction photovoltaic devices. Depositions were carried out to produce a number of different thicknesses of intrinsic layer at each of the varying dilutions, and the results of this experimental series are summarized in FIG. 1.

Referring now to FIG. 1 there is shown a graphic representation of the data from the first experimental series in which open circuit voltage (Voc) of the resultant cells is plotted versus I layer thickness. Voc has been selected as an indicator of device quality, since, in a conventional P-I-N type cell it is relatively independent of the thickness of the intrinsic layer of a particular cell. As will be seen from the data, the open circuit voltage of the cells is quite independent of cell thickness when hydrogen dilution is low. At higher dilutions, however, Voc decreases with increasing cell thickness, and decrease is greatest for the most dilute process gas. This decrease in open circuit voltage is indicative of the fact that the material of the intrinsic layer is becoming more and more microcrystalline. That is to say, deposition conditions drift across the amorphous microcrystalline threshold as a function of thickness of the depositing layer, even though all other deposition process parameters are maintained constant. Therefore, the conclusion to be drawn from the graphic data of FIG. 1 is that in order to maintain deposition conditions near the amorphous/microcrystalline threshold, the amount of diluent gas in the process gas mixture should be decreased as a function of increasing layer thickness.

Figure 2:
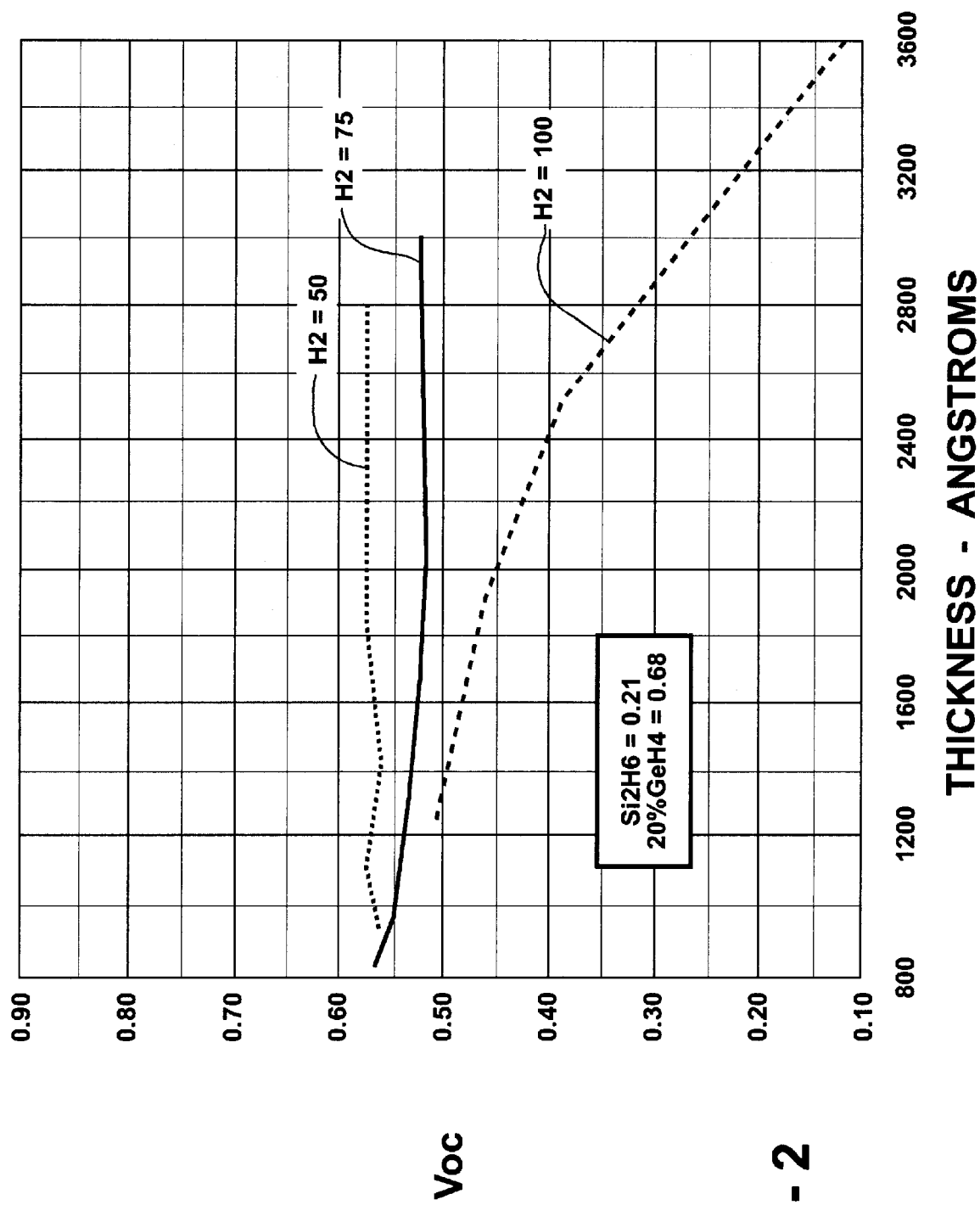
FIG. 2 is a graph showing the open circuit voltage of a second series of photovoltaic devices as a function of the thickness of the intrinsic layer of each device.

Referring now to FIG. 2, there are shown results of a similar experimental series carried out utilizing a process gas mixture comprised of 0.21 SCCM of $Si_2H_6$ and 0.68 SCCM of a 20% mixture of $GeH_4$ in $H_2$, together with 50, 75 or 100 SCCM of hydrogen diluent. This process gas mixture is typical of those employed for the fabrication of a relatively low band gap, high germanium alloy cell of the type utilized as the bottom cell of a triple junction photovoltaic device. Again, it will be seen that material quality tends to decline, particularly at higher hydrogen dilutions, as a function of increasing layer thickness. Again, it is clear that hydrogen dilution must be decreased as a function of increasing layer thickness, if material quality is to be maintained.

It has also been found in accord with the present invention that the amorphous/microcrystalline threshold will vary as a function of increasing germanium content in a silicon-germanium alloy material. This is clearly observed when comparing FIGS. 1 and 2. For low Ge content as in FIG. 1, amorphous to microcrystalline transition takes place at a hydrogen flow of 75 SCCM. For higher Ge content, as in FIG. 2, the intrinsic layer is still amorphous at this flow. Often, it is desirable to profile the band gap of an intrinsic layer throughout its thickness so as to adjust the electrical properties of the resultant semiconductor device. In profiled gap devices, the ratio of silicon to germanium in the alloy will vary as a function of layer thickness. In accord with the present invention it has been found that as the germanium content of the silicon-germanium alloy increases, the amount of hydrogen diluent required to maintain the deposition process at the amorphous/microcrystalline threshold must also increase. This effect is superimposed upon the previously discussed effect wherein hydrogen dilution is decreased as thickness increases.

To illustrate the effect of hydrogen dilution and band gap profiling, another series of P-I-N type photovoltaic devices were prepared. These devices were similar to those illustrated in FIG. 1, insofar as they comprised midgap silicon-germanium alloy devices; however, these devices had a profiled band gap wherein the band gap of the intrinsic layer initially decreased as a function of thickness, for approximately nine-tenths of the thickness of the layer, and then increased again for the remaining thickness.

In the first cell, the hydrogen dilution profile was kept constant, that is to say it did not change as a result of the changing ratio of germanium and silicon. The open circuit voltage of this cell was 0.83 V and its fill factor was 0.71. A second cell was prepared in which the profile was incorrect in accord with the present invention; that is to say, as the germanium content of the alloy increased, the amount of hydrogen diluent decreased. This cell had an open circuit voltage of 0.84 V and a fill factor of 0.69. A third cell was prepared by a process wherein the amount of hydrogen diluent increased as a function of increasing germanium content. This is the appropriate profiling in accord with the present invention. This cell had an open circuit voltage of 0.845 V and a fill factor of 0.72. The foregoing illustrates that varying the hydrogen diluent in accord with the present invention provides superior photovoltaic devices. The cell in which no hydrogen profiling occurred was inferior to the one with appropriate profiling, but superior to the one with the inappropriate profile. Clearly, the foregoing illustrates that amorphous/microcrystalline threshold, and hence material quality and device performance, are dependent upon process gas composition which includes both the ratio of the semiconductor precursor gasses, in this instance silicon and germanium, as well as the presence of diluent gas.

While the foregoing has been described with reference to silicon germanium alloy cells, the teaching thereof is applicable to other compositions of semiconductor material as silicon alloys, germanium alloys and other semiconductors. Also, while hydrogen has generally been discussed as the diluent gas, it will be apparent to one of skill in the art that other gases such as deuterium, inert gases and the like will also follow similar relationships.

The present invention recognizes that superior semiconductor alloys are fabricated when deposition conditions in a plasma deposition process are maintained near the amorphous/microcrystalline threshold, and further recognizes that this threshold will vary as a function of the thickness of the depositing semiconductor layer; and as a function of changes in process gas composition, in those instances where the composition of the depositing conductor is being varied. Specifically, the amount of hydrogen (or deuterium) diluent should generally be decreased as a function of increasing semiconductor layer thickness, while the amount of hydrogen (or deuterium) diluent should be increased as a function of increasing germanium content in a germanium-silicon alloy material.

In view of the foregoing, other modifications and variations of the present invention will be apparent to one of skill in the art. The foregoing discussion and description is illustrative of some particular embodiments of the present invention, but is not meant to be a limitation upon the practice thereof. It is the following claims, including all equivalents, which define the scope of the invention.

What is claimed is:

1. In a process for the plasma deposition of a layer of semiconductor material of the type wherein a process gas which includes a precursor of said semiconductor material is energized with electromagnetic energy so as to create a plasma therefrom, which plasma deposits a layer of said semiconductor material onto a substrate, said process being characterized by a group of deposition parameters comprising: process gas composition, process gas pressure, power density of said electromagnetic energy, and substrate temperature; wherein there is defined an amorphous/microcrystalline threshold for said deposition parameters such that there is a microcrystalline set of values for said deposition parameters wherein when said semiconductor material is deposited thereunder, it is microcrystalline, and an amorphous set of values for said deposition parameters wherein when said semiconductor material is deposited thereunder it is amorphous, and wherein said amorphous/microcrystalline threshold varies during the deposition of said semiconductor layer as a function of the thickness thereof; wherein the improvement comprises in combination:

maintaining said deposition parameters at values which are within said amorphous set but which are near to the amorphous/microcrystalline threshold, during the entire time said layer of semiconductor material is being deposited by varying the value of at least one of said deposition parameters as a function of the thickness of the semiconductor material which has been deposited.

2. The process of claim 1, wherein said process gas comprises a member selected from the group consisting of: $SiH_4$, $Si_2H_6$, $GeH_4$, $SiF_4$ and combinations thereof.

3. The process of claim 2, wherein said process gas further includes a member selected from the group consisting of hydrogen, deuterium, a halogen and combinations thereof.

4. The process of claim 1, wherein the step of varying the value of at least one of said deposition parameters comprises varying the composition of said process gas.

5. The process of claim 4, wherein the step of varying the composition of said process gas comprises varying the amount of a diluent gas in said process gas.

6. The process of claim 5, wherein said diluent gas is selected from the group consisting of hydrogen, deuterium, and combinations thereof.

7. The process of claim 4, wherein the step of varying the value of at least one of said deposition parameters comprises varying the power density of said electromagnetic energy.

8. The process as in claim 1 wherein said semiconductor material includes silicon and germanium therein and wherein said process gas includes a silicon containing compound, a germanium containing compound and a diluent selected from the group consisting of hydrogen, deuterium and combinations thereof, and wherein the ratio of said silicon containing compound to said germanium containing compound is varied while said semiconductor material is being deposited so that the silicon/germanium ratio of said layer of semiconductor material varies as a function of layer thickness; and wherein the step of maintaining said deposition parameters at values which are within said amorphous set but which are nearer to the amorphous/microcrystalline threshold comprises increasing the concentration of said diluent gas in the process gas as the ratio of said germanium containing compound to said silicon containing compound therein increases.

* * * * *

UNITED STATES PATENT AND TRADEMARK OFFICE
CERTIFICATE OF CORRECTION

PATENT NO. : 6,274,461 B1 Page 1 of 1
DATED : August 14, 2001
INVENTOR(S) : Subhendu Guha et al.

It is certified that error appears in the above-identified patent and that said Letters Patent is hereby corrected as shown below:

Column 1,
Lines 11-12, should read as -- This invention was made with Government support under NREL Subcontract No. ZAK-8/17619-09, Prime Contract No. DE-AC36-98GO10337 awarded by the Department of Energy. The Government has certain rights in this invention. --

Signed and Sealed this

Twenty-first Day of October, 2003

JAMES E. ROGAN
*Director of the United States Patent and Trademark Office*